US012648399B2

(12) United States Patent
Kuo et al.

(10) Patent No.: US 12,648,399 B2
(45) Date of Patent: Jun. 2, 2026

(54) SYSTEMS AND METHODS FOR TRAY CASSETTE WAREHOUSING

(71) Applicant: Taiwan Semiconductor Manufacturing Co., Ltd., Hsin-Chu (TW)

(72) Inventors: Tsung-Sheng Kuo, New Taipei City (TW); Yang-Ann Chu, Hsinchu City (TW); Chih-Hung Huang, Hsinchu County (TW); Guan-Wei Huang, Hsinchu County (TW); Jiun-Rong Pai, Jhubei City (TW); Hsuan Lee, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 713 days.

(21) Appl. No.: 18/074,410

(22) Filed: Dec. 2, 2022

(65) Prior Publication Data

US 2023/0095609 A1      Mar. 30, 2023

Related U.S. Application Data

(63) Continuation of application No. 16/731,679, filed on Dec. 31, 2019, now Pat. No. 11,527,425.

(51) Int. Cl.
*H10P 72/30* (2026.01)
*B65G 1/04* (2006.01)
(Continued)

(52) U.S. Cl.
CPC ............ *H10P 72/3218* (2026.01); *B65G 1/04* (2013.01); *B65G 1/1373* (2013.01); *B65G 47/46* (2013.01);
(Continued)

(58) Field of Classification Search
CPC ........... H01L 21/6773; H01L 21/67736; H01L 21/67745; H01L 21/67766;
(Continued)

(56) References Cited

U.S. PATENT DOCUMENTS

2004/0118980 A1*   6/2004   Chang ................. H01L 21/6773
                                                      246/1 C
2004/0238623 A1*  12/2004   Asp ................... B29C 45/14811
                                                      235/491
(Continued)

FOREIGN PATENT DOCUMENTS

CN          101236419 A      8/2008
CN          102951401 A      3/2013
(Continued)

*Primary Examiner* — Ernesto A Suarez
*Assistant Examiner* — Laurence R Brothers
(74) *Attorney, Agent, or Firm* — The Marbury Law Group, PLLC

(57) ABSTRACT

A system, includes, a semiconductor processing unit, an Automated Materials Handling System (AMHS) vehicle, and a warehouse apparatus, wherein the warehouse apparatus comprises at least one input port, at least one output port, and at least one load/unload port, wherein the warehouse apparatus is configured to perform one of the following: receiving a plurality of tray cassette containers from the AMHS vehicle at the at least one input port, transporting at least one tray cassette in each of a plurality of tray cassette containers to the at least one load/unload port via the at least one input port, transporting at least one first tray from the at least one tray cassette to the semiconductor processing unit via a tray feeder conveyor, and receiving at least one second tray from the semiconductor processing unit via the tray feeder conveyor.

20 Claims, 10 Drawing Sheets

(51) Int. Cl.

| | |
|---|---|
| *B65G 1/137* | (2006.01) |
| *B65G 47/46* | (2006.01) |
| *B65G 47/90* | (2006.01) |
| *H10P 72/00* | (2026.01) |
| *H10P 72/10* | (2026.01) |

(52) U.S. Cl.
CPC .......... *B65G 47/90* (2013.01); *H10P 72/3222* (2026.01); *H10P 72/3304* (2026.01); *H10P 72/3402* (2026.01); *B65G 2201/0297* (2013.01); *H10P 72/00* (2026.01); *H10P 72/0611* (2026.01); *H10P 72/16* (2026.01); *H10P 72/3212* (2026.01); *H10P 72/3221* (2026.01); *H10P 72/3404* (2026.01)

(58) Field of Classification Search
CPC ......... H01L 21/67271; H01L 21/67333; H01L 21/67721; H01L 21/67733; H01L 21/67769; H01L 2221/67; H01L 21/6733; B65G 1/1373; B65G 47/46; B65G 47/90; B65G 2201/0297; B65G 1/04
See application file for complete search history.

(56) References Cited

U.S. PATENT DOCUMENTS

| | | | | |
|---|---|---|---|---|
| 2004/0259402 A1* | 12/2004 | Lee | ................... | H01L 21/67259 |
| | | | | 439/173 |
| 2006/0018737 A1* | 1/2006 | Wang | ................ | H01L 21/67727 |
| | | | | 414/222.01 |
| 2007/0289844 A1* | 12/2007 | Fukazawa | ......... | H01L 21/67383 |
| | | | | 198/465.1 |
| 2009/0038987 A1* | 2/2009 | Hyobu | .................... | H10P 72/18 |
| | | | | 206/509 |
| 2013/0322990 A1* | 12/2013 | Chen | ................... | H01L 21/6773 |
| | | | | 414/217 |
| 2014/0262979 A1* | 9/2014 | Bonora | ............ | H01L 21/67271 |
| | | | | 209/577 |

FOREIGN PATENT DOCUMENTS

| | | |
|---|---|---|
| CN | 104380454 A | 2/2015 |
| CN | 207329428 U | 5/2018 |

\* cited by examiner

300

400

408

412

412

412

412

<u>600</u>

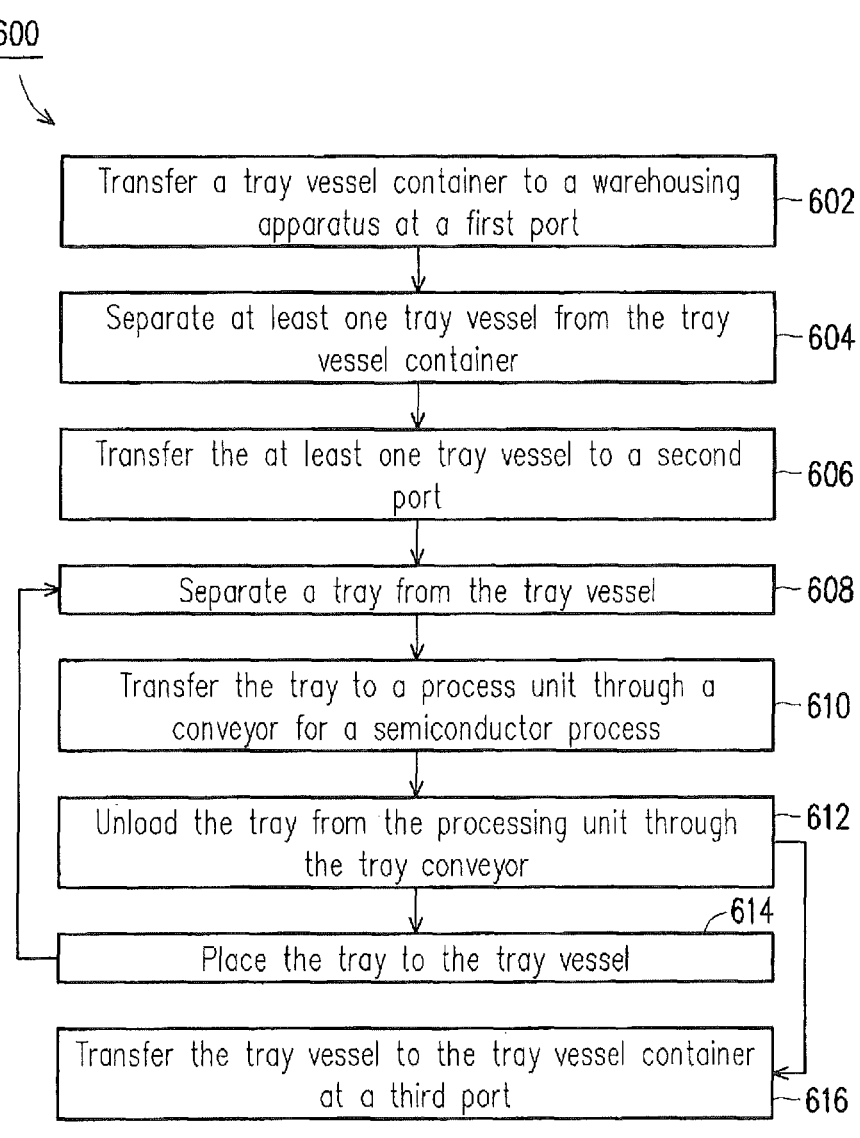

Transfer a tray vessel container to a warehousing apparatus at a first port ─602

Separate at least one tray vessel from the tray vessel container ─604

Transfer the at least one tray vessel to a second port ─606

Separate a tray from the tray vessel ─608

Transfer the tray to a process unit through a conveyor for a semiconductor process ─610

Unload the tray from the processing unit through the tray conveyor ─612

Place the tray to the tray vessel ─614

Transfer the tray vessel to the tray vessel container at a third port ─616

FIG. 6

SYSTEMS AND METHODS FOR TRAY CASSETTE WAREHOUSING

RELATED APPLICATIONS

This application is a continuation of U.S. patent application Ser. No. 16/731,679 filed Dec. 31, 2019, the entirety of which is incorporated herein by reference.

BACKGROUND

Modern manufacturing processes are typically highly automated to manipulate materials and devices and create a finished product. However, quality control and maintenance processes often rely on human skill, knowledge and expertise for inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 6 illustrate a flow chart of a method for performing a tray transferring process, in accordance with some embodiments of the present disclosure.

DETAILED DESCRIPTION OF EXEMPLARY EMBODIMENTS

Figure 1:
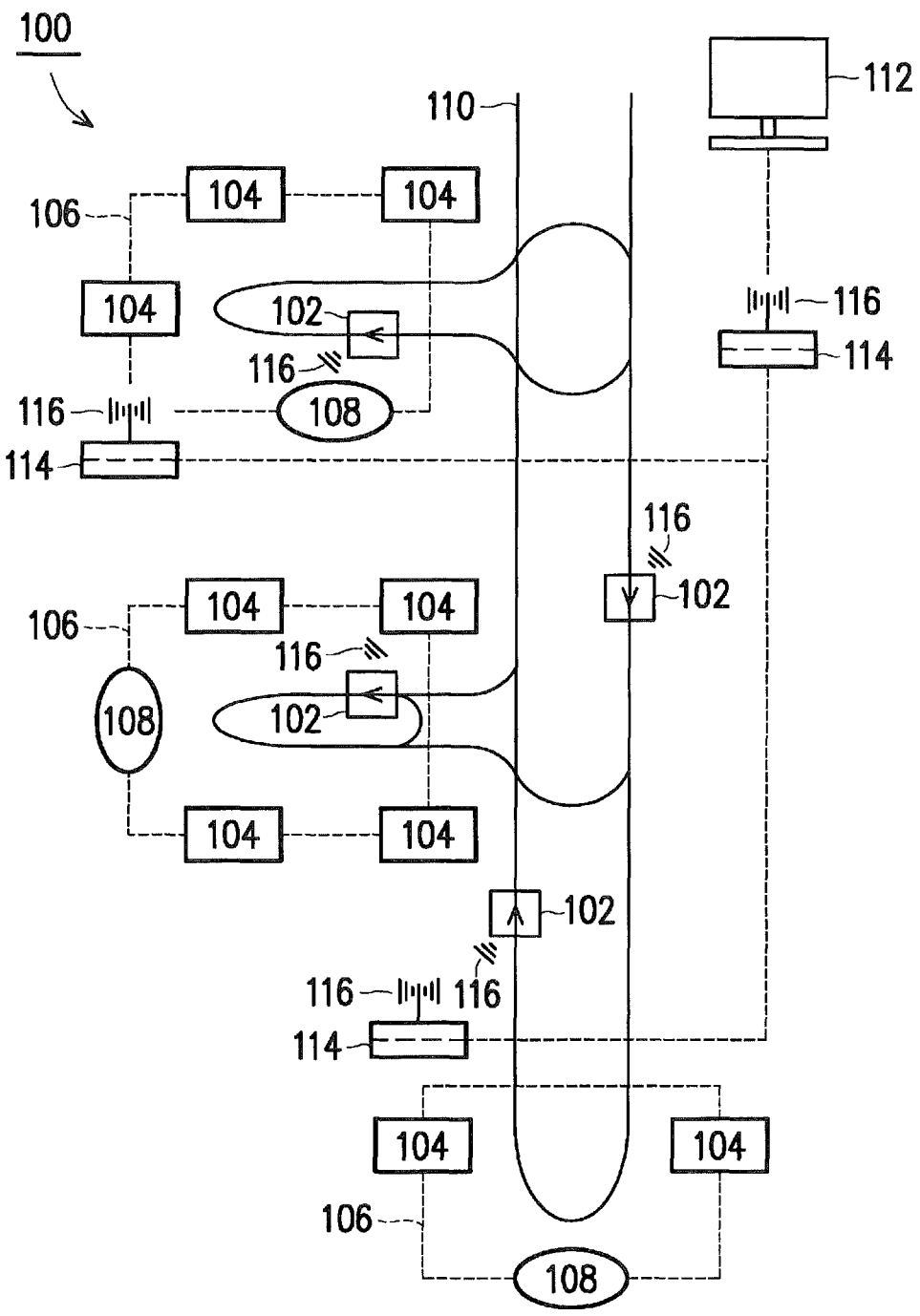
FIG. 1 illustrates a schematic of a semiconductor fabrication facility equipped with a plurality of Automated Materials Handling System (AMHS) vehicles transporting semiconductor substrates between semiconductor processing units for processing, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed is a system and method for automatically loading and unloading tray cassettes between Automated Materials Handling System (AMHS) vehicles and semiconductor processing units to reduce human impact on the transport processes.

FIG. 1 illustrates a schematic of a semiconductor fabrication facility 100 equipped with a plurality of AMHS vehicles 102 transporting semiconductor substrates between semiconductor processing units 104 for processing, in accordance with some embodiments of the present disclosure. In a semiconductor fabrication facility 100, a plurality of semiconductor processing units 104 with similar functions are generally clustered in process bays 106. At least one storage station 108 is typically included and located at one end of a process bay 106. An automated inter-bay transport of containers by AMHS vehicles 102 between storage stations 108 of process bays 106 can be guided on overhead transport rails 110. Each of storage stations 108 contains a number of vertically-stacked storage bins for storing semiconductor substrates or containers (e.g., tray cassettes). An AMHS vehicle that transports semiconductor substrates typically in containers can be in a form of an overhead hoist transport (OHT), overhead shuttle (OHS), automated guided vehicle (AGV), rail guided vehicle (RGV), conveyor system, or a combination thereof, in accordance with various embodiments.

Semiconductor substrates are processed or measured at the respective semiconductor processing units 104. When a process or a measurement is completed on a semiconductor substrate, the container, such as Front Opening Unified Pods (FOUP) and Front Opening Shipping Box (FOSB), with semiconductor substrate from the semiconductor processing unit 104 can be unloaded, sent to a storage station 108 of a process bay 106, or directly load to an inter and/or intra-bay AMHS vehicle using a robotic mechanical transferring and sorting mechanism, as discussed in detail below. In some embodiments, dedicated inter-bay and intra-bay AMHS vehicles 102 can be used to transfer containers on a transport rail 110. In particular, the inter-bay AMHS vehicles 102 move containers between storage stations 108 in different process bays 106, whereas intra-bay AMHS vehicles 102 move containers between storage stations 108 and equipment 104, or between equipment 104 within the same process bay 106, in accordance with various embodiments.

In some embodiments, an AMHS vehicle 102 picks up a container (e.g., tray cassette container) from a first storage station 108 and transports it on rail 110 to a second storage station 108 in the first process bay 106 or a second different process bay 106, in accordance with some embodiments, where the next processing or measurement step is to be performed. The semiconductor substrate in the container stay in the second storage station 108 while waiting for the next processing or measurement step. In some embodiments, an AMHS vehicle 102 can automatically pick up the container, transport the container on rail 110, and load the semiconductor substrates into the corresponding semiconductor processing unit 104 through corresponding OHT port for the next processing or measurement, which is discussed in detail in FIG. 2 below. Once all required processes on the semiconductor substrates in the container or at least one tray are complete, the semiconductor substrates and the tray are stored back in the container and transported by AMHS vehicles 102 on the transport rail 110 to a destination such as a test facility or a packaging facility. Each time a container is transferred from one place to another, a barcode (e.g., RFID) on the container or on the tray is scanned by a barcode reader (not shown) along the transport rail 110 or in the storage station 108. The transfer of the semiconductor substrates contained therein is recorded in a computer system for operating the AMHS vehicles 102. When a semiconductor processing unit 104 completes a step of a process on a semiconductor substrate, a host computer 112 determines whether the semiconductor substrate should be sent to one of the storage stations 108 and/or empty trays/container should be recycled. For example, if a nearby first storage station 108 is full, the container is sent to a nearby storage station 108 in the same or a different process bay 106; if the next step of the process will be performed on the semiconductor substrates in the container immediately, the container may be sent directly to its destination, in accordance with various embodiments. In some other embodiments, trays in the same container or from different containers can be reordered or regrouped using such robotic mechanical transferring and sorting mechanism as discussed in detail below.

In some embodiments, the robotic mechanical transferring and sorting mechanism, which is discussed in detail below in FIG. 2, may be attached to the semiconductor processing unit 104 to perform local transportation, handling, sorting and loading/unloading tasks. In some embodiments, the mechanism receives containers (e.g., tray cassette containers, FOUPs, FOSBs, die vessel containers, etc.) directly from the AMHS vehicles 102 through a first OHT port. In some embodiments, the mechanism can separate semiconductor substrates or trays from the containers in a vertical direction, wherein separated semiconductor substrates or trays can be loaded on a tray feeder which then transports the semiconductor substrates or trays to attached semiconductor processing unit 104 for processing or measurement through a load/unload port in a horizontal direction. When the processing or measurement is completed, the semiconductor substrates or trays can be transported out of the semiconductor processing unit 104 on the tray feeder back to the container through the load/unload port. The container is then transported and loaded on the AMHS vehicles 102 through a second OHT port.

Figure 2A:
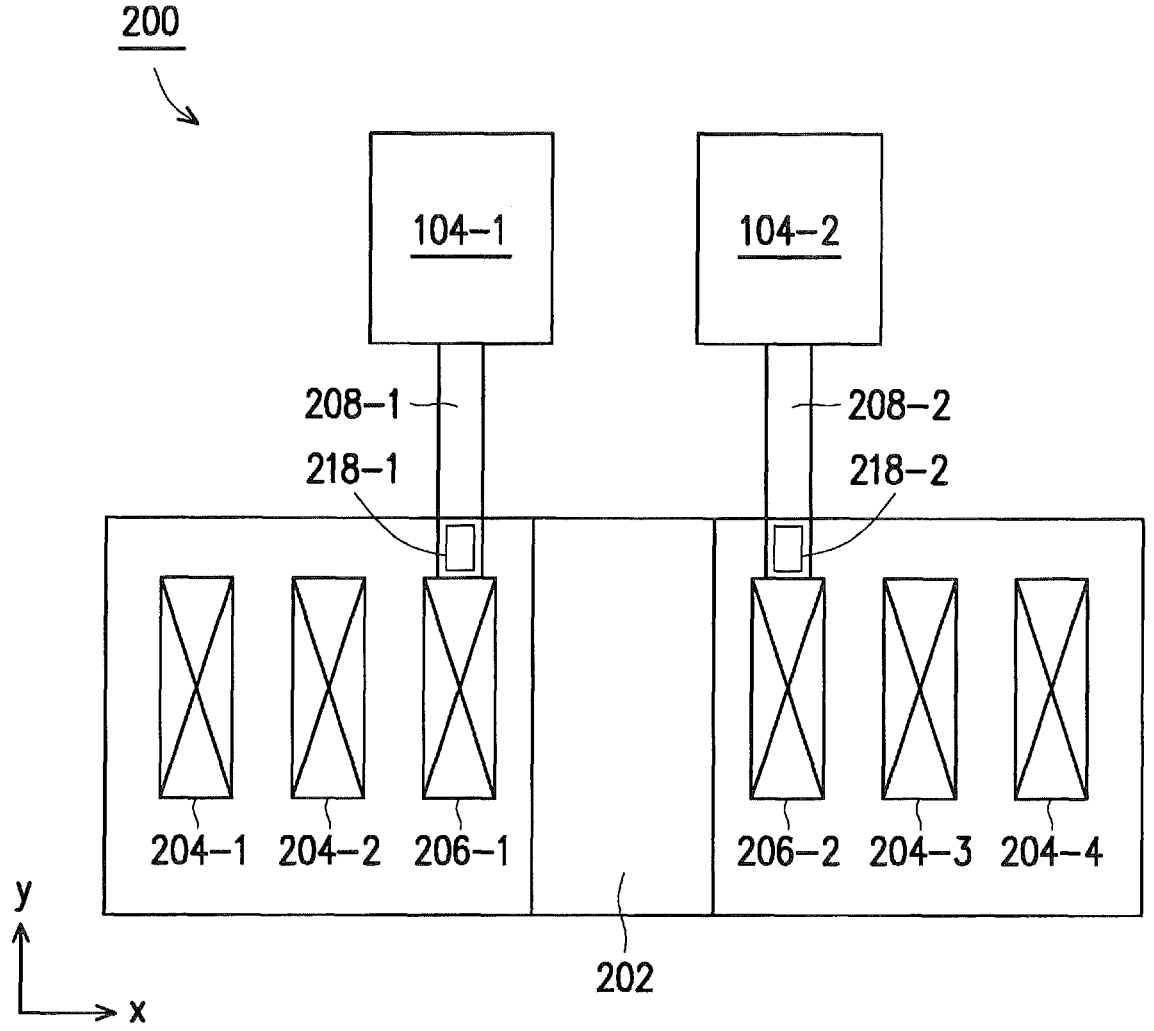
FIGS. 2A-2C illustrate a top-view, a front-view and a side-view block diagrams of a warehouse apparatus, in accordance with some embodiments.
Figure 2B:
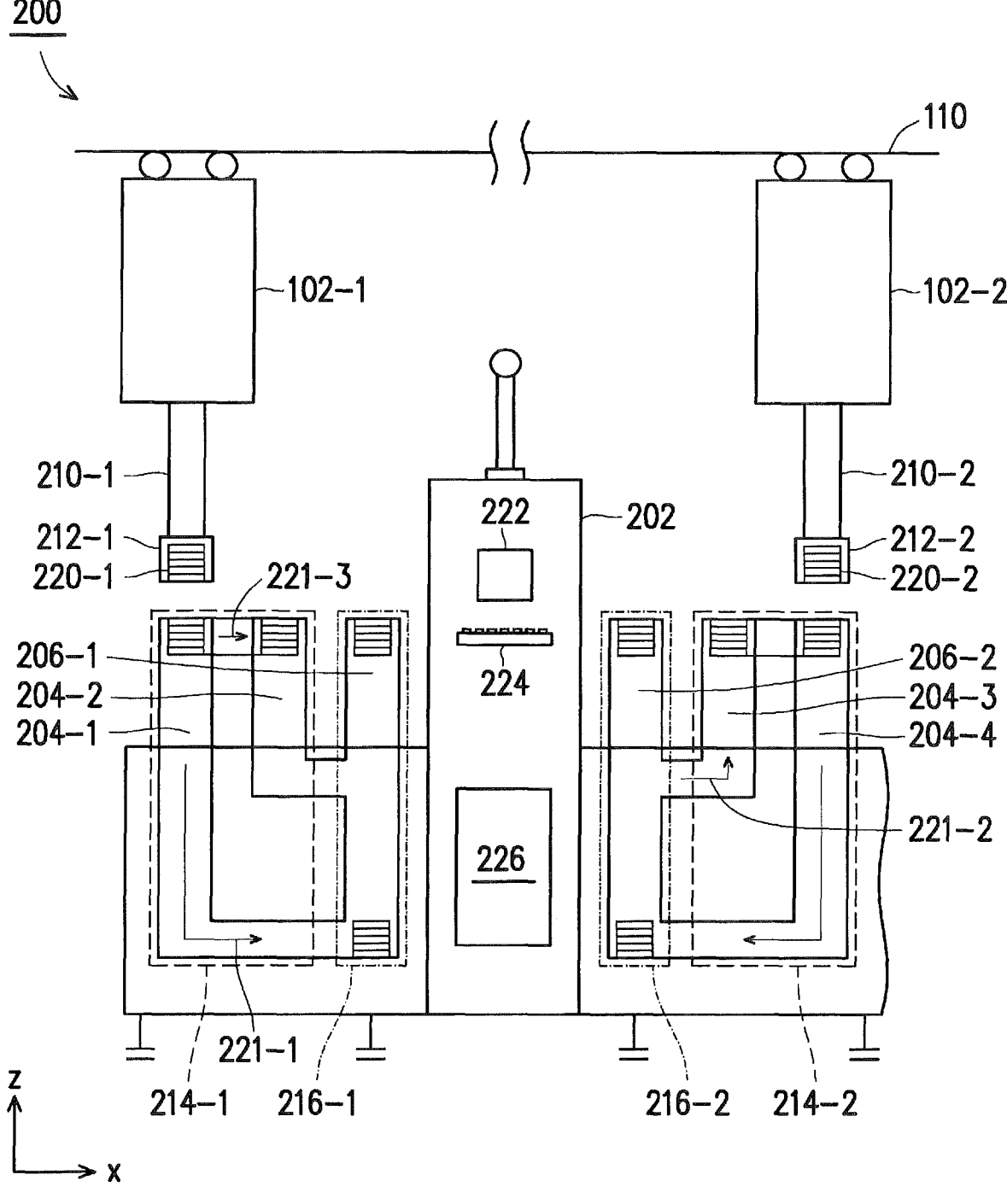
Figure 2C:
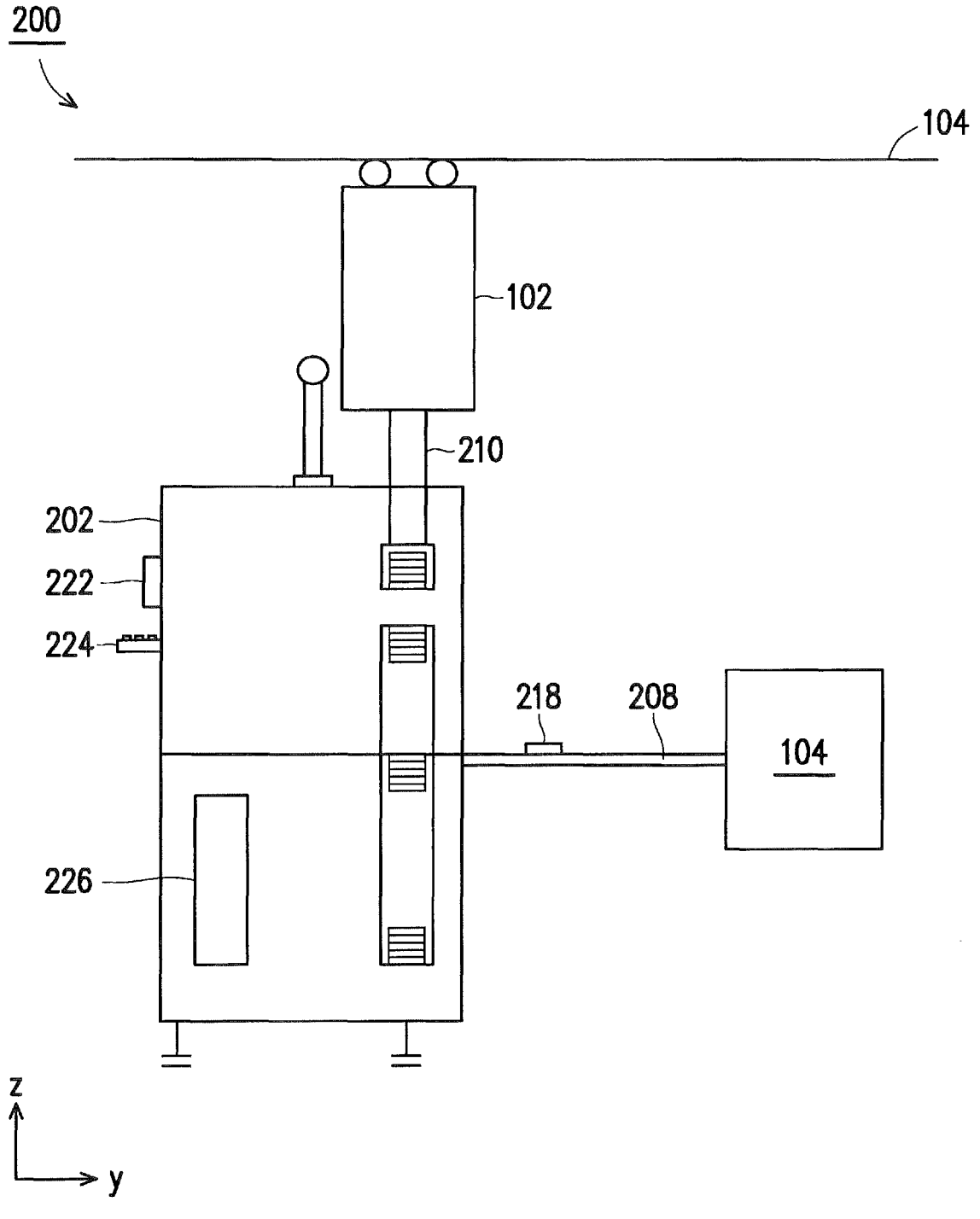

FIGS. 2A-2C illustrate a top-view, a front-view and a side-view block diagrams of a warehouse apparatus 200, in accordance with some embodiments. The warehouse apparatus 200 may be interfaced with a semiconductor processing unit 104 and an AMHS vehicle 102. The AMHS vehicle 102 may be any system to which the warehouse apparatus may receive a container and/or provide the container to. For example, the AMHS vehicle 102 moves containers to and/or from other warehouse apparatus 200 or a semiconductor processing unit 104 within a facility. In some embodiments, the container is one of the following: a wafer container, a tray cassette container, a FOUP, and a FOSB.

In the illustrated embodiment, the warehouse apparatus 200 may include a control tower 202, two storage zones 214-1/214-2, and two exchange zones 216-1/216-2. In the illustrated embodiment, a first storage zone 214-1 comprises at least two OHT ports including a first input port 204-1 and a first output port 204-2; and a second storage zone 214-2 comprises a second input port 204-4 and a second output port 204-3. A first exchange zone 216-1 comprises a first load/unload port 206-1; and a second exchange zone 216-2 comprises a second load/unload port 206-2. In the illustrated embodiment, the warehouse apparatus 102 may be configured to interface with the first input port 204-1 and the first output port 204-2 with the first load/unload port 206-1, and the second input port 201-4 and the second output port 201-3 with the second load/unload port 206-2.

In the illustrated embodiment, a first container 212-1 carrying a plurality of trays, wherein each of the plurality of trays contains dies received from the AMHS vehicle 102-1 for processing/measurement can be stored in a first storage zone 214-1 of the warehouse apparatus 200. In some embodiments, a second container 212-2 with empty trays unloaded by the AMHS vehicle 102-2 for tray recycling may be also stored within a second storage zone 214-2 of the warehouse apparatus 200. In some other embodiments, the second container 212-2 is an empty container without trays.

In the illustrated embodiment, the warehouse apparatus 200 may be configured to receive the first container 212-1 from the AMHS vehicle 102-1 guided on overhead rails 110. In some embodiments, the first container 212-1 with trays containing dies is transported on an elevator 210-1 in the z direction to the first input port 204-1 of the first storage zone 214-1. The first container 212-1 is then stored in the first storage zone 214-1. The warehouse apparatus 200 may then bring the first container 212-1 from the first storage zone 214-1 to the first exchange zone 216-1.

The first container 220-1 carries at least one tray cassette 220-1 with a plurality of trays, wherein the at least one tray cassette 220-1 may be separated from the first container 212-1 and the empty first container 212-1 can be stored in the first storage zone 214-1. The warehouse apparatus 200 may then bring the at least one tray cassette 220-1 to the load/unload port 206 in the first exchange zone 216-1 through transport mechanisms in the x and z direction following a first pathway 221-1. The warehousing apparatus 200 may then further bring the at least one tray cassette 220-1 in the z direction so that each of the plurality of trays on the at least one tray cassette 220-1 can be loaded onto the tray feeder and recycle conveyor 208-1 and so that dies in each of the plurality of trays 218-1 on the at least one tray cassette 220-1 may be processed or measured in a first semiconductor processing unit 104-1.

Also, the warehouse apparatus 200 may be configured to bring empty trays 218-2 to the second output port 206-2 in the second exchange zone 216-2 after processing or measurement in a second semiconductor processing unit 104-2 through the tray feeder and recycle conveyor 208-2. Additionally, once sufficiently loaded with trays 218-2, the full tray cassette 220-2 is then moved from the second load/unload port 206-2 by transport mechanisms in the z and x directions following a second pathway 221-2 to a second container 212-2 at the second output port 204-3. In some other embodiments, a full tray cassette 220-2 may be combined with other tray cassettes (e.g., other full tray cassettes) at a second container 212-2. The second container 212-2 may be retrieved from the second output port 204-3 in the second storage zone 214-2. Once the second container 212-2 is full, the full second container 212-2 may be brought out to a second AMHS vehicle 102-2 through a corresponding elevator 210-2 for further processing.

In some embodiments, an empty container at an input port 204 (e.g., the first input port 204-1) can be transported to an adjacent output port (e.g., the second output port 204-2), which can be then used to receive tray cassettes with empty trays for recycling or tray cassettes with dies for further processing.

In particular embodiments, a tray cassette robotic arm (not shown) in the warehouse apparatus 200 with an end effector can be configured to move the tray cassette 220 between the input/output ports 204 and the load/unload ports 206 along the pathways 221. The tray cassette robotic arm end effector may include a lower surface configured to slide under the bottom wall of a tray cassette 220 to move the tray cassette 220. The tray cassette robotic arm end effector may also include side gates configured to laterally support the tray cassette so that individual trays on the tray cassette do not slide off the tray cassette while in transit. The tray cassette robotic arm end effector may include an open front opposite to a rear portion which interfaces with the rest of the tray cassette robotic arm. For example, the tray cassettes 220 may be moved to and/or from any of the first input port 204-1, the first output port 204-2, the first load/unload port 206-1 secured on the tray cassette robotic arm end effector. Furthermore, although a specific type of end effector and a specific type of robotic arm is discussed above, any type of end effector and any type of robotic arm may be utilized in the warehouse apparatus 200 as desired for different applications in various embodiments. It should be noted other types of end effectors may be utilized in the tray cassette robotic arm of the warehouse apparatus 200 for grasping or holding a tray cassette within a work envelope of the robotic arm, such as a pressure gripper (e.g., gripping by applying pressure to an object, such as with a pincer type motion), an area gripper (e.g., gripping by surrounding an object to be manipulated), a vacuum gripper (e.g., gripping by suction force), and a magnetic gripper (e.g., gripping by use of electromagnetic forces), and the like. In certain embodiments, the end effector may be a gripper hand with at least two fingers, with one opposing the other. The multiple fingers may be utilized to apply pressure as a pressure gripper and or as an area gripper.

In the illustrated embodiment, the control tower 202 comprises a computer control system with a display unit 222, an input device 224 and a controller 226. The computer control system may further include additional components, such as, for example, input/output controllers, communication links, etc. The computer control system in the control tower 202 can be used, for example, to implement processes to receive containers, to separate and/or transport tray cassettes to semiconductor processing units, and to load trays into the tray cassettes and further to tray containers.

Figure 3:
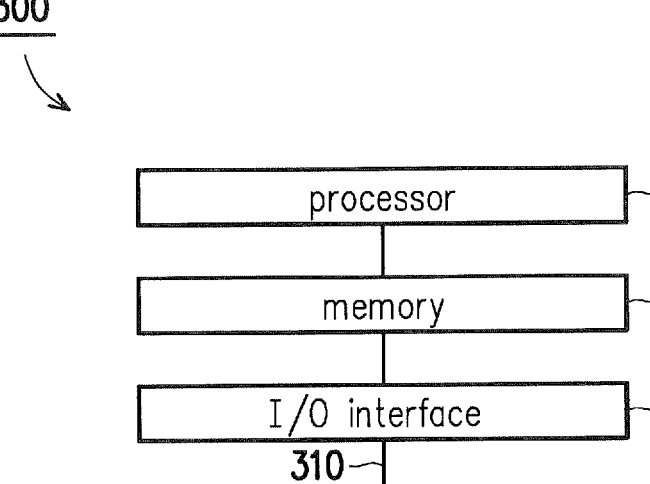
FIG. 3 illustrates an exemplary block diagram of a controller in a warehouse apparatus, in accordance with some embodiments of the invention.

FIG. 3 illustrates an exemplary block diagram of a controller 300 in a warehouse apparatus 200, in accordance with some embodiments of the invention. It is noted that the controller 300 is merely an example, and is not intended to limit the invention. Accordingly, it is understood that additional functional blocks may be provided in or coupled to the controller 300 of FIG. 3, and that some other functional blocks may be omitted or only briefly described herein. It should be also noted that the functionalities provided in each of the components and modules of the controller 300 can be combined or separated into one or more modules.

In the illustrated embodiment, the controller 300 comprises a processor 302, a memory 304, an input/output interface 306, a communications interface 308, and a system bus 310, in accordance with some embodiments. The processor 302 may comprise any processing circuitry operative to control the operations and process of a tray cassette robotic arm in a warehouse apparatus 200. In various aspects, the processor 302 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor 622 also may be implemented by a controller, a microcontroller, an application specific integrated circuit (ASIC), a field programmable gate array (FPGA), a programmable logic device (PLD), and so forth.

In various aspects, the processor 302 may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory 304.

In some embodiments, the memory 304 may comprise any machine-readable or computer-readable media capable of storing data, including both volatile/non-volatile memory and removable/non-removable memory. The memory 304 may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the robot controller of the tray-handling system 304.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 304 may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface 306 may comprise any suitable mechanism or component to enable a user to provide input to the warehouse apparatus 200 to provide output to the user. For example, the I/O interface 306 may comprise any suitable input mechanism, including but not limited to, a button, keypad, keyboard, click wheel, touch screen, or motion sensor. In some embodiments, the I/O interface 306 may comprise a capacitive sensing mechanism, or a multi-touch capacitive sensing mechanism (e.g., a touchscreen).

In some embodiments, the I/O interface 306 may comprise a visual peripheral output device for providing a display visible to the user. For example, the visual peripheral output device may comprise a screen such as, for example, a Liquid Crystal Display (LCD) screen, incorporated into the warehouse apparatus 200. As another example, the visual peripheral output device may comprise a movable display or projecting system for providing a display of content on a surface remote from the warehouse apparatus 200. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the warehouse apparatus 200, information regarding ongoing communications operations, information regarding incoming communications requests, or device operation screens, to name only a few.

In some embodiments, the communications interface 308 may comprise any suitable hardware, software, or combination of hardware and software that is capable of coupling the warehouse apparatus 200 to one or more networks and/or additional devices. The communications interface 308 may be arranged to operate with any suitable technique for controlling information signals using a desired set of communications protocols, services or operating procedures. The communications interface 308 may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 308 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface 308 may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

The system bus 310 couples the processor 302, the memory 304, the I/O interface 306, and the communication interface 308 to one another, as necessary. The system bus 310 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCM-CIA) Bus, Small Computer System Interface (SCSI) or other proprietary bus, or any custom bus suitable for computing device applications.

Figure 4A:
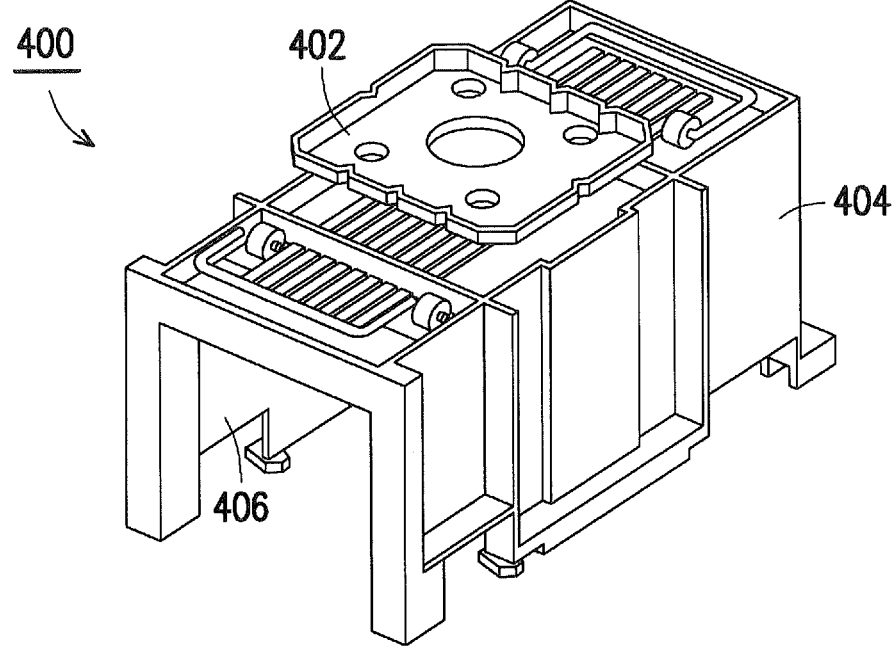
FIGS. 4A-4C illustrate schematic diagrams of perspective views and a front view of a tray cassette container 400, in accordance with some embodiments.
Figure 4B:
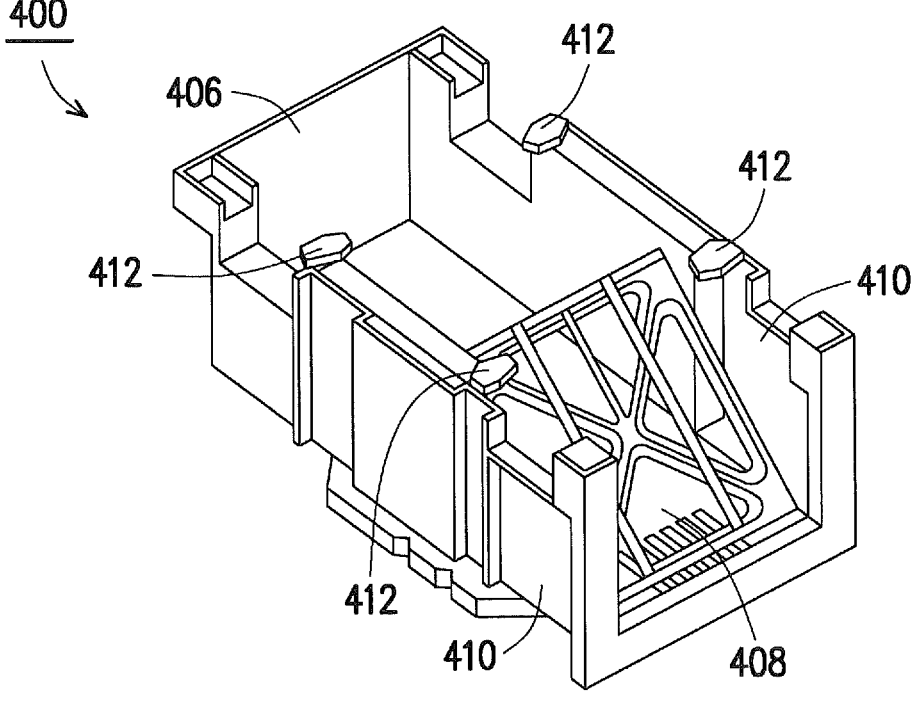
Figure 4C:
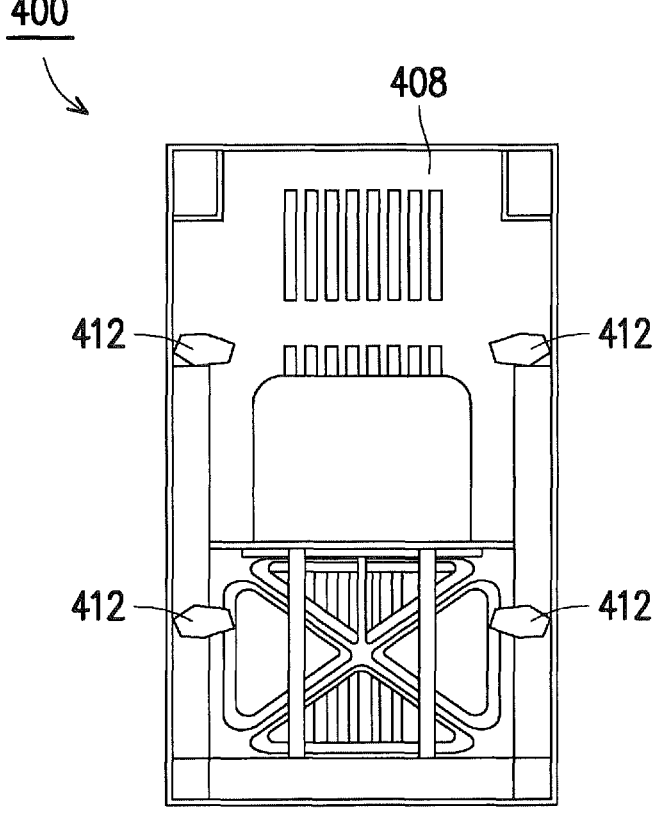

FIGS. 4A-4C illustrate schematic diagrams of perspective views and a front view of a tray cassette container 400, in accordance with some embodiments. In particular embodiments, the tray cassette container 400 may include a handle 402, using which a robotic arm on an elevator of an ARMS vehicle 102 may be configured to secure and move the tray cassette container 400. The tray cassette container 400 further comprises a housing 404 to confine trays, dies or wafers in the housing during transportation. In some other embodiments, the tray cassette container 400 may be configured to store tray cassettes stacked one on the other. For example, the tray cassette container 400 may include smooth internal walls 406 without specific concavities such as slots in which tray cassettes may be disposed and/or guided along. In particular embodiments, the stray cassette container 400 may include a handle 402, using which a robotic arm may be configured to secure and move the tray cassette container 400.

As illustrated, the internal walls 406 of the tray cassette container 400 may be substantially smooth and without specific concavities such as slots in which die vessels may be disposed. In this case, holding pins 412 that may be rotated to a first position to secure the tray cassette in the tray cassette container 400 and rotated to a second position to release the tray cassette from the tray cassette container 400. Also, the handle 402 may protrude from the tray cassette container 400. Furthermore, the tray cassette container 400 may include a bottom wall 408 and sidewalls 410. This bottom wall may be considered to be part of the tray cassette container 400 when connected with the side walls 410 and not part of the tray cassette container 400 when not connected with the side walls 410. In certain embodiments, being connected to the side walls 410 may refer to a physical connection and/or a physical securement to the side walls 410.

In some other embodiments, the tray cassette container 400 may include slots. The slots may be concavities from which tray cassettes may be secured and/or guided along during insertion or removal. When within a tray cassette container 400, the tray cassettes may be located at set predetermined vertical distances from each other, as determined by the slots in the tray cassette container 400.

Figure 5A:
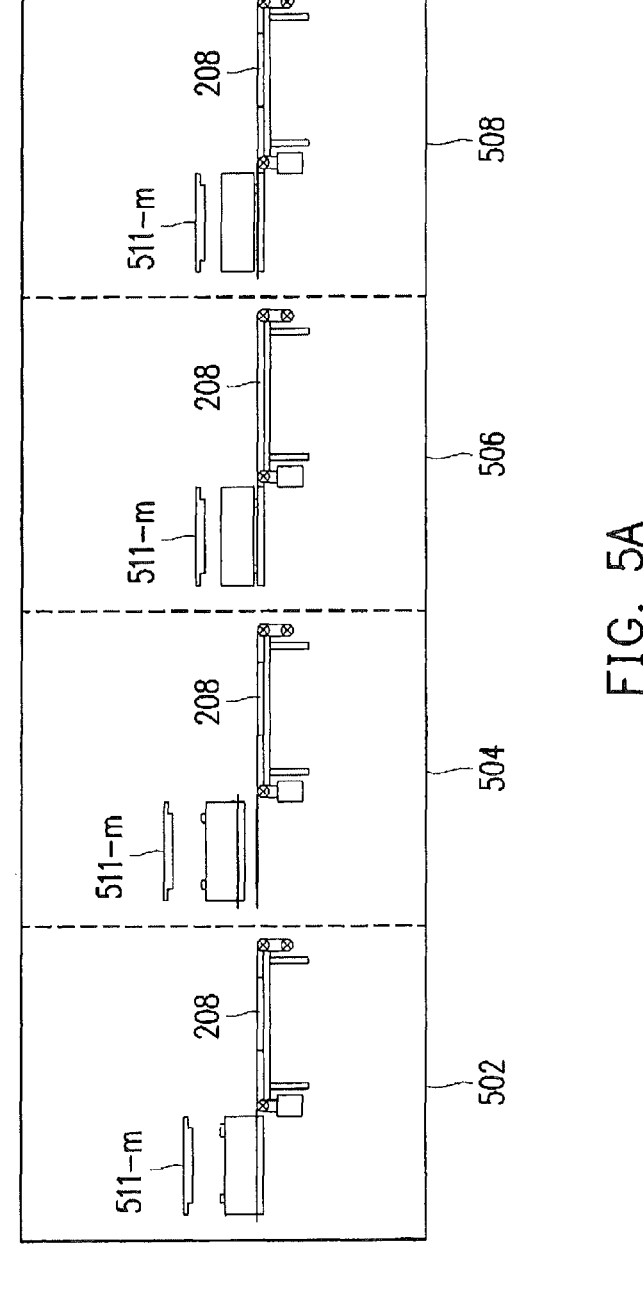
FIG. 5A illustrates a schematic diagram of a process for separating a tray from a tray cassette and loading to a tray feeder, in accordance with some embodiments of the present disclosure.

FIG. 5A illustrates a schematic diagram of a process 500 for separating a tray from a tray cassette and loading to a tray feeder, in accordance with some embodiments of the present disclosure. It is noted that the process 500 is merely an example, and is not intended to limit the present disclosure. Accordingly, it is understood that additional operations may be provided before, during, and after the process 500 of FIG. 5A, certain operations may be omitted, certain operations may be performed concurrently with other operations, and that some other operations may only be briefly described herein.

At operation 502, a top tray is lifted and removed from the tray cassette using a clamp fixed on a linear transfer mechanism. After removing the top tray 511-*m*, the rest of the trays in the tray cassette can be shifted upward to allow a separation of individual trays 511. In some embodiment, removing the top tray 511-*m* allows the rest of the tray to be lifted by 30 millimeters. At operation 504, using the bottom tray as an example, lock pins for the second tray to the bottom are shifted from their relax positions to lock positions so as to secure the second tray to the bottom. At operation 506, the second tray to the bottom is then lifted. In the illustrated embodiment, the second tray to the bottom can be lifted by 30 millimeters. At operation 508, the bottom tray is pushed out to a tray feeder conveyor 208 using a tray feeding system (not shown).

Figure 5B:
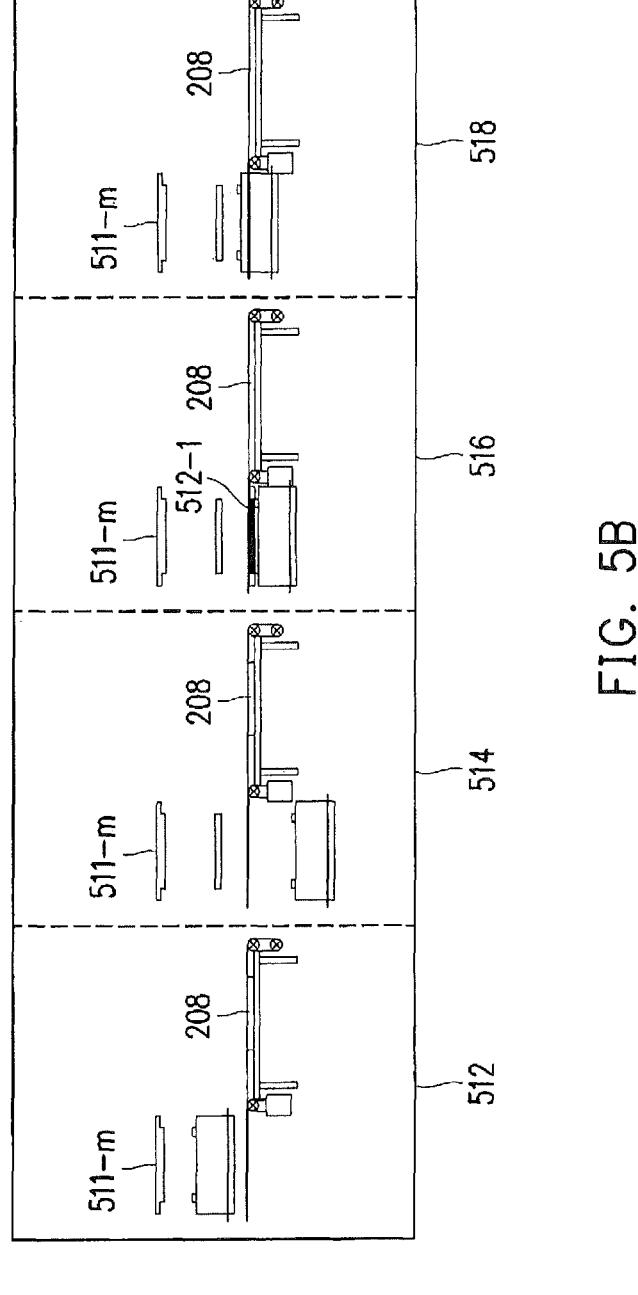
FIG. 5B illustrates a schematic diagram of a process for loading a tray from a tray feeder onto a tray cassette, in accordance with some embodiments of the present disclosure.

FIG. 5B illustrates a schematic diagram of a process 510 for loading a tray from a tray feeder 208 onto a tray cassette, in accordance with some embodiments of the present disclosure. It is noted that the process 510 is merely an example, and is not intended to limit the present disclosure. Accordingly, it is understood that additional operations may be provided before, during, and after the process 510 of FIG. 5B, certain operations may be omitted, certain operations may be performed concurrently with other operations, and that some other operations may only be briefly described herein.

At operation 512, the tray cassette for receiving a tray from a semiconductor processing unit is prepared to be shifted down. At operation 514, the tray cassette for receiving the tray from the semiconductor process unit is shifted down. For example, when the tray is configured to be loaded at the top of the tray cassette, the tray cassette can be shifted to a level where its top surface can receive the tray cassette from the tray feeder conveyor 208. At operation 516, the tray is transferred out of the semiconductor processing unit onto the tray feeder conveyor and pushed by a tray feeding mechanism to the top of the tray cassette. At operation 518, the tray cassette is the shifted up to secure the tray on the tray cassette.

FIG. 6 illustrate a flow chart of a method 600 for performing a tray transferring process, in accordance with some embodiments of the present disclosure. The tray transferring process may be performed by a warehouse apparatus 200, as introduced above. It is noted that the method 600 is merely an example, and is not intended to limit the present disclosure. Accordingly, it is understood that additional operations may be provided before, during, and after the method 600 of FIG. 6, certain operations may be omitted, certain operations may be performed concurrently with other operations, and that some other operations may only be briefly described herein.

The method 600 starts with operation 602, in which a tray cassette container is loaded to a first port on a warehouse apparatus 200, according to some embodiments. In some embodiments, the tray cassette container is received from an Automated Materials Handling System (AMHS) vehicle 102. The AMHS vehicle 102 may be any system to which the warehouse apparatus 200 may receive a tray cassette container and/or provide the tray cassette container to. For example, the AMHS vehicle 102 moves tray cassette containers to and/or from other warehouse apparatus 200 or a semiconductor processing unit 104 within a facility. An AMHS vehicle 102 transporting containers can be in a form of an overhead hoist transport (OHT), overhead shuttle (OHS), automated guided vehicle (AGV), rail guided vehicle (RGV), conveyor system, or a combination thereof, in accordance with various embodiments.

In certain embodiments, the warehouse apparatus 200 may include a storage zone 214, and an exchange zone 216. In various embodiments, the warehouse apparatus 200 comprises a first port 204-1 in the storage zone 214, a second port 206 in the exchange zone 216, and a third port 204-2 in the storage zone 214. In some embodiments, the first port 204-1 is an input port; the second port 206 is a load/unload port; and the third port 204-2 is an output port. In the illustrated embodiment, the warehouse apparatus 200 may be configured to interface with the input port 204-1 and the output port 204-2 with a load/unload port 206. In the illustrated embodiment, the warehouse apparatus 200 may be configured to receive a container 212 from the AMHS vehicle 102 guided on overhead rails 110. In some embodiments, the container 212 with a plurality of trays containing dies is transported on an elevator 210 in the z direction to the input port 204-1 of the storage zone 214.

The method 600 continues with operation 604, in which at least one tray cassette is separated from the tray cassette container, according to some embodiments. The tray cassette 220 with a plurality of trays 218 in the container 212 may be separated from the container 212 and the empty tray cassette container 212 can be stored at the storage zone 214-1. In some embodiments, the tray cassette is separated from the tray cassette container by rotating a plurality of holding pins from a first position to a second position so as to release the tray cassette from the tray cassette container. In some other embodiments, the tray cassette container 400 may be configured to store tray cassettes stacked one on the other. For example, the tray cassette container 400 may include smooth internal walls 406 without specific concavities such as slots in which tray cassettes may be disposed and/or guided along. In particular embodiments, the stray cassette container 400 may include a handle 404, using which a robotic arm may be configured to secure and move the tray cassette container 400.

The method 600 continues with operation 606, in which the tray cassette are transferred from the first port to the second port of the warehouse apparatus 200, according to some embodiments. In some embodiments, after being separated from the tray cassette container can be transported from the first port to the second port through a tray cassette robotic arm, which allows the tray cassette to move along a first pathway 221-1 in the x and z direction.

In particular embodiments, the tray cassette robotic arm (not shown) with an end effector can be configured to move tray cassettes 220 between input/output ports 204 and load/unload ports 206 along the pathways 221. The tray cassette robotic arm end effector may include a lower surface configured to slide under the bottom wall of a tray cassette 220 to move the tray cassette 220. The tray cassette robotic arm end effector may also include side gates configured to laterally support the tray cassette so that individual trays on the tray cassette do not slide off the tray cassette while in transit. The tray cassette robotic arm end effector may include an open front opposite to a rear portion which interfaces with the rest of the tray cassette robotic arm. For example, the tray cassettes may be moved to and/or from any of the input port 204-1, output port 204-2, load/unload port 206 secured on the tray cassette robotic arm end effector. Furthermore, although a specific type of end effector and a specific type of robotic arm is discussed above, any type of end effector and any type of robotic arm may be utilized in the warehouse apparatus 200 as desired for different applications in various embodiments. It should be noted other types of end effectors may be utilized in a robotic arm of the warehouse apparatus 200 for grasping or holding an object and manipulating the object within a work envelope of the robotic arm, such as a pressure gripper (e.g., gripping by applying pressure to an object, such as with a pincer type motion), an area gripper (e.g., gripping by surrounding an object to be manipulated), a vacuum gripper (e.g., gripping by suction force), and a magnetic gripper (e.g., gripping by use of electromagnetic forces), and the like. In certain embodiments, the end effector may be a gripper hand with at least two fingers, with one opposing the other. The multiple fingers may be utilized to apply pressure as a pressure gripper and or as an area gripper.

The method 600 continues with operation 608, in which a tray is separated from the at least one tray cassette, according to some embodiments. In some embodiments, the tray in the tray cassette at the second port of the warehouse apparatus 200 is separated from the tray cassette by first removing a top tray in the tray cassette The method 600 continues with operation 610, in which the tray with dies is transferred through a tray conveyor to a semiconductor processing unit for a semiconductor process, in according to some embodiments.

The method 600 continues with operation 612, in which the tray is unloaded from the semiconductor processing unit through the tray conveyor, according to some embodiments.

The method 600 continues with operation 614, in which the tray is loaded on the tray cassette, according to some embodiments.

The method 600 continues with operations 608 through 614 until the semiconductor processing is completed on the plurality of trays on the tray cassette, according to some embodiments. The method 600 continues with operation 616 in which the tray cassette is transferred to the tray cassette container at a third port of the warehouse apparatus, according to some embodiments.

In one embodiment, a system, includes, a semiconductor processing unit, an Automated Materials Handling System (AMHS) vehicle, and a warehouse apparatus, wherein the warehouse apparatus comprises at least one input port, at least one output port, and at least one load/unload port, wherein the warehouse apparatus is configured to perform one of the following: receiving a plurality of tray cassette containers from the AMHS vehicle at the at least one input port, transporting at least one tray cassette in each of a plurality of tray cassette containers to the at least one load/unload port via the at least one input port, transporting at least one first tray from the at least one tray cassette to the semiconductor processing unit via a tray feeder conveyor, and receiving at least one second tray from the semiconductor processing unit via the tray feeder conveyor.

In another embodiment, a system, includes, a semiconductor processing unit, an Automated Materials Handling System (AMHS) vehicle, and a warehouse apparatus, wherein the warehouse apparatus comprises at least one input port, at least one output port, and at least one load/unload port, wherein the warehouse apparatus is configured to perform one of the following: receiving a plurality of tray cassette containers from the AMHS vehicle at the at least one input port, transporting at least one tray cassette in each of a plurality of tray cassette containers to the at least one load/unload port via the at least one input port, transporting at least one first tray from the at least one tray cassette to the semiconductor processing unit via a tray feeder conveyor, and receiving at least one second tray from the semiconductor processing unit via the tray feeder conveyor, wherein the warehouse apparatus is configured to interface with the semiconductor processing unit through the at least one load/unload port, and to interface with the AMHS vehicle through the at least one input port and the at least one output port.

Yet, in another embodiment, a method, includes, receiving a plurality of tray cassette containers from an automatic material handling system (AMHS) vehicle at an input port of a warehouse apparatus; transporting at least one tray cassette in each of a plurality of tray cassette containers to a load/unload port of the warehouse apparatus; transporting a first tray from the at least one tray cassette to a semiconductor processing unit via a tray feeder conveyor; and receiving at least one second tray from the semiconductor processing unit via the tray feeder conveyor.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a semiconductor processing unit;
a plurality of trays, wherein each of the plurality of trays has a first barcode and is configured to contain at least one semiconductor die or is an empty tray containing no semiconductor dies;
a plurality of tray cassettes, wherein each of the plurality of tray cassettes is configured to contain at least one of the plurality of trays or is an empty tray cassette containing no trays;
a plurality of tray cassette containers rotating holding pins, a handle, and a housing structure, wherein each of the plurality of tray cassette containers has a second barcode and is configured to contain at least one of the plurality of tray cassettes or is an empty tray cassette container containing no tray cassettes; and
a warehouse apparatus, wherein the warehouse apparatus comprises a storage zone including at least one input port and at least one output port, and an exchange zone including at least one load/unload port, wherein the warehouse apparatus is configured to:

receive a first tray cassette container of the plurality of tray cassette containers from an external source at the at least one input port;

store the first tray cassette container in the storage zone;

separate at least one of the plurality of tray cassettes contained within the first tray cassette container;

transport each of the separated tray cassettes individually from the at least one input port in the storage zone along a first direction, then a second direction different from the first direction to the exchange zone;

transport each of the separated tray cassettes individually to the at least one load/unload port along the first direction;

separate each of the trays contained within each of the separated tray cassettes; and transport each of the separated trays individually along a third direction different from the first direction and second direction to the semiconductor processing unit.

2. The system of claim 1, wherein the external source comprises an automated material handling system (AMHS), and wherein the warehouse apparatus is further configured to:

interface with the semiconductor processing unit through the at least one load/unload port; and interface with the AMHS vehicle through the at least one input port and the at least one output port.

3. The system of claim 1, wherein the warehouse apparatus is further configured to perform one of the following:

transport at least one of the plurality of tray cassette containers from the at least one input port to the at least one output port; or combine individual tray cassettes to be contained within an empty tray cassette container.

4. The system of claim 3, wherein the individual tray cassettes include one of the following:

an empty first tray; or the first tray with the at least one semiconductor die.

5. The system of claims 3, wherein the warehouse apparatus is further configured to receive at least one second tray from the semiconductor processing unit via a tray feeder conveyor, wherein the warehouse apparatus is further configured to:

interface with the semiconductor processing unit through the at least one load/unload port; and interface with the external source through the at least one input port and the at least one output port.

6. The system of claim 5, wherein the warehouse apparatus is configured to:

transport any one of the separated tray cassettes from the load/unload port to the at least one output port;

place each of the separated tray cassettes within one of the plurality of tray cassette containers; and load the plurality of tray cassette containers on an automated material handling system (AMHS) vehicle.

7. The system of claim 1, wherein the warehouse apparatus further comprises a tray cassette robotic arm, wherein the tray cassette robotic arm is configured to transport any one of the separated tray cassettes between the load/unload port and any one of the following:

the input port; or the output port.

8. A system, comprising:

a semiconductor processing unit;

a plurality of trays, wherein each of the plurality of trays having a first barcode and is configured to contain at least one semiconductor die or is an empty tray containing no semiconductor dies;

a plurality of tray cassettes, wherein each of the plurality of tray cassettes is configured to contain at least one of the plurality of trays or is an empty tray cassette containing no trays;

a plurality of tray cassette containers having rotating holding pins, a handle, and a housing structure, wherein each of the plurality of tray cassette containers having a second barcode is configured to contain at least one of the plurality of tray cassettes or is an empty tray cassette container containing no tray cassettes; and a warehouse apparatus, wherein the warehouse apparatus comprises a storage zone including at least one input port and at least one output port, and an exchange zone including at least one load/unload port, wherein the warehouse apparatus is configured to:

receive a first tray cassette container of the plurality of tray cassette containers from an external source at the at least one input port;

separate at least one of the plurality of tray cassettes contained within the first tray cassette container;

transport each of the separated tray cassettes individually from the at least one input port along a first direction, then a second direction to the exchange zone;

combine individual tray cassettes to be contained within an empty tray cassette container;

transport each of the separated tray cassettes individually to the at least one load/unload port along the first direction;

separate each of the trays contained within each of the separated tray cassettes;

transport each of the separated trays individually along a third direction to the semiconductor processing unit via a tray feeder conveyor, wherein the tray feeder conveyor is connected to the at least one load/unload port.

9. The system of claim 8, wherein the warehouse apparatus is further configured to:

transport the plurality of tray cassette containers from the at least one input port to the at least one output port.

10. The system of claim 9, wherein individual tray cassette includes one of the following:

an empty first tray; or the first tray with the at least one semiconductor die.

11. The system of claim 8, wherein the warehouse apparatus is further configured to receive at least one second tray from the semiconductor processing unit via the tray feeder conveyor, wherein the warehouse apparatus is further configured to:

interface with the semiconductor processing unit through the at least one load/unload port; and interface with the external source through the at least one input port and the at least one output port.

12. The system of claim 8, wherein the warehouse apparatus further comprises a tray cassette robotic arm, wherein the tray cassette robotic arm is configured to transport any one of the separated tray cassettes between the load/unload port and at least one of the following:

the input port; or the output port.

13. The system of claim 8, wherein the warehouse apparatus is configured to:

transport any one of the separated tray cassettes from the load/unload port to the at least one output port;

place each of the separated tray cassettes within one of the plurality of tray cassette containers; and load the plurality of tray cassette containers on an automated material handling system (AMHS) vehicle.

14. A method, comprising:

receiving a first tray cassette container of a plurality of tray cassette containers having rotating holding pins, a handle, and a housing structure from an automatic material handling system (AMHS) vehicle at an input port of a warehouse apparatus, wherein each of the plurality of tray cassette containers is configured to contain at least one of a plurality of tray cassettes or is an empty tray cassette container containing no tray cassettes, wherein each of the plurality of tray cassettes is configured to contain at least one of a plurality of trays or is an empty tray cassette containing no trays, wherein each of the plurality of trays having a first barcode is configured to contain at least one semiconductor die or is an empty tray containing no semiconductor dies;

storing the first tray cassette container in a storage zone of the warehouse apparatus;

separating the at least one of the plurality of tray cassettes contained within the first tray cassette container;

transporting each of the separated tray cassettes individually from at least one input port of the warehouse apparatus along a first direction, then a second direction to an exchange zone of the warehouse apparatus;

combining individual tray cassettes to be contained within an empty tray cassette container;

transporting each of the separated tray cassettes individually to the load/unload port of the exchange zone along the first direction;

separating each of the trays contained within each of the separated tray cassettes; and transporting each of the separated trays individually along a third direction to a semiconductor processing unit via a tray feeder conveyor, wherein the tray feeder conveyor is connected to the load/unload port.

15. The method of claim 14 further comprising:

receiving at least one tray from the semiconductor processing unit via the tray feeder conveyor; and transporting the plurality of tray cassette containers from the input port to an output port of the warehouse apparatus.

16. The method of claim 15, wherein the at least one tray includes one of the following:

an empty first tray; or the first tray with the at least one semiconductor die.

17. The method of claim 14, further comprising:

transporting any one of the separated tray cassettes from the load/unload port to an output port;

placing each of the separated tray cassette within one of the plurality of tray cassette containers; and loading the plurality of tray cassette containers on the AMHS vehicle.

18. The method of claim 14, wherein the warehouse apparatus further comprises a tray cassette robotic arm, wherein the tray cassette robotic arm is configured to transport any one of the separated tray cassettes between the load/unload port and at least one of the following:

the input port; or the output port.

19. The method of claim 18, wherein the rotating holding pins are configured to secure or release any one of the plurality of tray cassettes upon rotating.

20. The method of claim 14, wherein each of the plurality of tray cassette containers includes a second barcode that is different from the first barcode.

* * * * *